(12) United States Patent
Horikawa et al.

(10) Patent No.: US 11,309,224 B2
(45) Date of Patent: Apr. 19, 2022

(54) FOLDED SUBSTRATE FOR STACKED INTEGRATED CIRCUIT DEVICES

(71) Applicant: SHINKO ELECTRIC INDUSTRIES CO., LTD., Nagano (JP)

(72) Inventors: Yasuyoshi Horikawa, Nagano (JP); Yoshihiro Ihara, Nagano (JP); Yoshihiro Kita, Nagano (JP); Hikaru Tanaka, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/214,284

(22) Filed: Dec. 10, 2018

(65) Prior Publication Data
US 2019/0198411 A1     Jun. 27, 2019

(30) Foreign Application Priority Data

Dec. 27, 2017   (JP) .............................. JP2017-252357

(51) Int. Cl.
*H01L 23/31*     (2006.01)
*H01L 23/498*   (2006.01)
(Continued)

(52) U.S. Cl.
CPC ...... *H01L 23/3114* (2013.01); *H01L 23/3128* (2013.01); *H01L 23/49827* (2013.01);
(Continued)

(58) Field of Classification Search
CPC ............. H01L 23/3114; H01L 23/5387; H01L 23/49827; H01L 23/66; H01L 25/16;
(Continued)

(56) References Cited

U.S. PATENT DOCUMENTS 5,128,831 A * 7/1992 Fox, III ............ H01L 23/49827
                                                      257/697
5,586,006 A * 12/1996 Seyama ................. H05K 1/141
                                                      361/719
(Continued)

FOREIGN PATENT DOCUMENTS

| JP | 2002171071 A | 6/2002 |
| JP | 2004228344 A | 8/2004 |
| JP | 4991518 | 5/2012 |

OTHER PUBLICATIONS

Japanese Application No. 2017-252357; Notification of Reasons for Rejection; dated Jun. 1, 2021; 7 pgs.

*Primary Examiner* — Nduka E Ojeh
*Assistant Examiner* — Gardner W. S. Swan
(74) *Attorney, Agent, or Firm* — Tarolli, Sundheim, Covell & Tummino LLP

(57) ABSTRACT

A semiconductor device includes a flexible wiring substrate. The wiring substrate includes at least two mounting portions and at least one connecting portion. The mounting portions are stacked spaced apart from each other. Each connecting portion is bent to connect two mounting portions that are adjacent in a stacking direction. The semiconductor device further includes at least one semiconductor chip mounted on at least one of the at least two mounting portions and a plurality of conductive connecting members connecting the mounting portions to each other in the stacking direction.

6 Claims, 3 Drawing Sheets

(51) Int. Cl.
  *H05K 1/14* (2006.01)
  *H01L 25/16* (2006.01)
  *H01L 23/538* (2006.01)
  *H01L 25/065* (2006.01)
  *H01L 23/66* (2006.01)

(52) U.S. Cl.
  CPC .......... *H01L 23/5387* (2013.01); *H01L 23/66* (2013.01); *H01L 25/0657* (2013.01); *H01L 25/16* (2013.01); *H05K 1/144* (2013.01); *H01L 2223/6655* (2013.01); *H01L 2225/06517* (2013.01); *H01L 2225/06527* (2013.01); *H01L 2225/06572* (2013.01)

(58) Field of Classification Search
  CPC ....... H01L 25/0657; H01L 2225/06572; H01L 2225/06527; H01L 2225/06517; H01L 2223/6655; H05K 1/144
  USPC ........................................................ 257/690
  See application file for complete search history.

(56) References Cited

U.S. PATENT DOCUMENTS

| | | | | |
|---|---|---|---|---|
| 5,646,446 | A * | 7/1997 | Nicewarner, Jr | H01L 23/5387 257/723 |
| 6,444,921 | B1 * | 9/2002 | Wang | H01L 23/49827 174/260 |
| 7,358,444 | B2 * | 4/2008 | Nickerson | H01L 23/5387 174/254 |
| 2004/0238931 | A1 * | 12/2004 | Haba | H01L 23/5387 257/686 |
| 2009/0090541 | A1 * | 4/2009 | Chia | H01L 24/19 174/254 |
| 2009/0309197 | A1 * | 12/2009 | Chow | H01L 23/3128 257/659 |
| 2015/0001717 | A1 * | 1/2015 | Karhade | H01L 24/17 257/741 |
| 2016/0293573 | A1 * | 10/2016 | Guo | H01L 23/5387 |

* cited by examiner

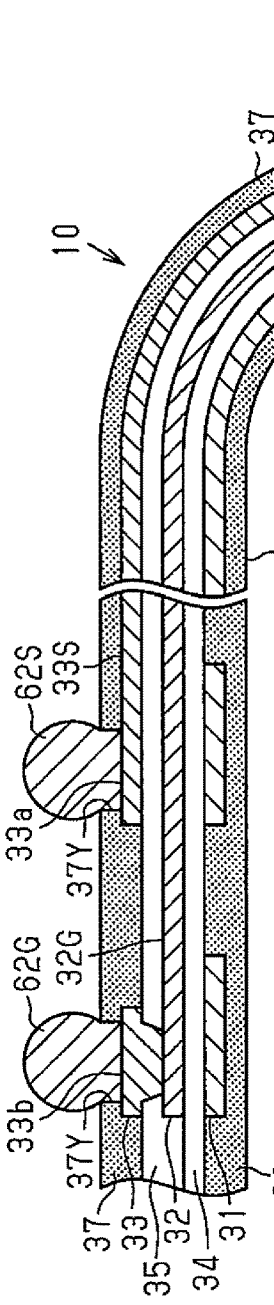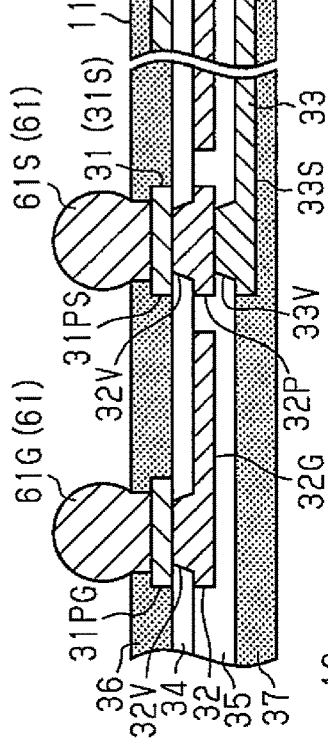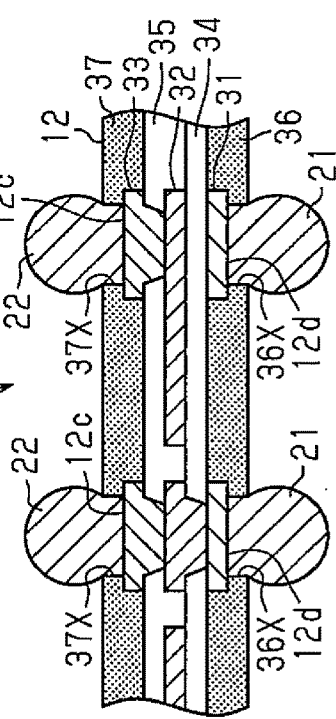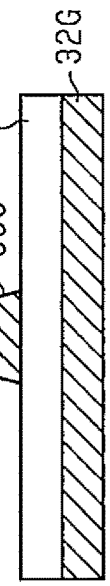
Fig.2A
Fig.2B
Fig.2C

FOLDED SUBSTRATE FOR STACKED INTEGRATED CIRCUIT DEVICES

CROSS-REFERENCE TO RELATED APPLICATIONS

This application is based upon and claims the benefit of priority from prior Japanese Patent Application No. 2017-252357, filed on Dec. 27, 2017, the entire contents of which are incorporated herein by reference.

FIELD

This disclosure is related to a semiconductor device.

BACKGROUND

A known semiconductor device includes semiconductor chips arranged in the vertical direction (refer to Japanese Patent No. 4991518). For example, a semiconductor device includes relay substrates, on which semiconductor chips are mounted, and connecting substrates, which connect terminals of the relay substrates.

SUMMARY

The semiconductor device described above includes multiple types of substrates, such as the relay substrates and the connection substrates, to arrange the semiconductor chips in the vertical direction. This hinders miniaturization of the semiconductor device.

One embodiment is a semiconductor device including a wiring substrate that has flexibility. The wiring substrate includes at least two mounting portions and at least one connecting portion. The at least two mounting portions are stacked spaced apart from each other. Each of the at least one connecting portion is bent to connect two of the at least two mounting portions that are adjacent in a stacking direction. The semiconductor device also includes at least one semiconductor chip mounted on at least one of the at least two mounting portions. The semiconductor device further includes a plurality of conductive connecting members connecting the at least two mounting portions to each other in the stacking direction.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 2A is a partially enlarged, cross-sectional view of the wiring substrate of FIG. 1A illustrating two adjacent mounting portions and a connecting portion located in between;

FIG. 2B is a partially enlarged, cross-sectional view of the wiring substrate of FIG. 1A illustrating an example signal transmission path including one of the mounting portions and conductive connecting members arranged on the upper and lower surfaces of the mounting portion;

FIG. 2C is a schematic cross-sectional view of an example transmission line formed in the wiring substrate of FIG. 2A;

DESCRIPTION OF THE EMBODIMENTS

Figure 1A:
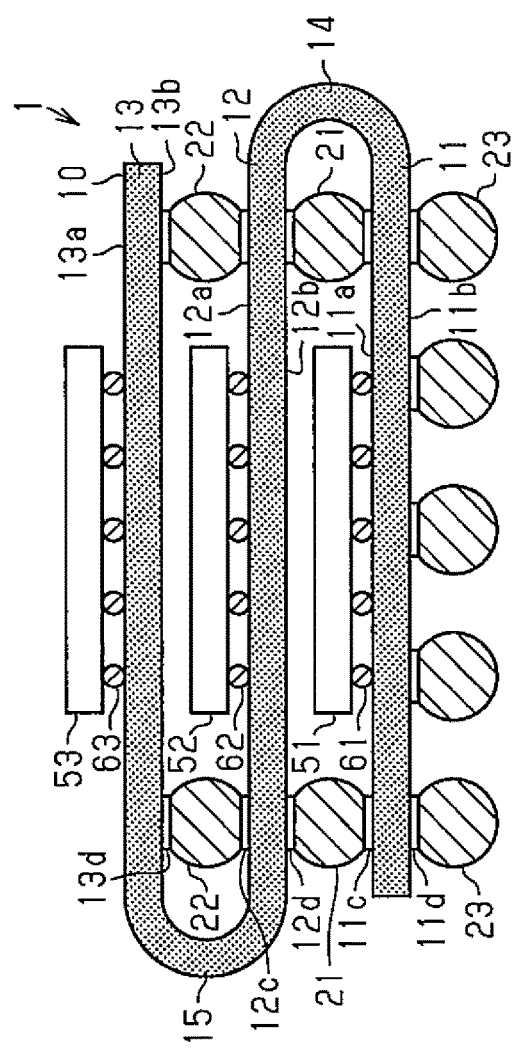
FIG. 1A is a schematic cross-sectional view of an example semiconductor device including an example wiring substrate and semiconductor chips mounted on the wiring substrate.

Embodiments will now be described. In the drawings, elements are illustrated for simplicity and clarity and have not necessarily been drawn to scale. To facilitate understanding, hatching lines may not be illustrated in the cross-sectional drawings.

As illustrated in FIG. 1A, a semiconductor device 1 includes a wiring substrate 10 and a plurality of (three in the present embodiment) semiconductor chips 51, 52, and 53.

The wiring substrate 10 has flexibility. The wiring substrate 10 includes insulation layers and wiring layers, which will be described in more detail below with respect to FIGS. 2A to 2C. The insulation layers may be, for example, flexible films of a resin material, such as polyimide resin or polyester resin, or a liquid crystal polymer. The wiring layers may be formed from, for example, copper (Cu) or a Cu alloy. The wiring substrate 10 may have a thickness of, for example, 0.1 mm to 0.3 mm.

The wiring substrate 10 includes at least two mounting portions (in the present example, three mounting portions 11, 12, and 13) and at least one connecting portion (in the present example, two connecting portions 14 and 15). The mounting portions 11 to 13 are stacked spaced apart from one another. The connecting portions 14 and 15 are each bent and connect two of the mounting portions 11 to 13 that are adjacent in the stacking direction. The stacking direction is the vertical direction as viewed in FIG. 1A and orthogonal to a mounting substrate.

Semiconductor chips 51 to 53 are mounted on upper surfaces 11a to 13a of the mounting portions 11 to 13.

Each of the semiconductor chips 51 to 53 is a bare chip and directly flip-chip mounted onto the wiring substrate 10 by solder bumps 61 to 63. The semiconductor chips 51 to 53 may each have a thickness of, for example, 0.1 mm. Each of the semiconductor chips 51 to 53 may be, for example, a logic chip such as a central processing unit (CPU) chip or a graphics processing unit (GPU) chip. Alternatively, each of the semiconductor chips 51 to 53 may be, for example, a memory chip such as a dynamic random access memory (DRAM) chip, a static random access memory (SRAM) chip, or a flash memory chip. The semiconductor chips 51 to 53, which are mounted on the wiring substrate 10, may be a combination of semiconductor chips having different functions (e.g., combination of one or more logic chips and one or more memory chips) or a combination of semiconductor chips of the same type.

The mounting portion 11 and the mounting portion 12, which is located immediately above the mounting portion 11, are connected to each other by solder balls 21. To facilitate understanding, FIG. 1A illustrates only two solder balls 21. Actually, there may be more solder balls 21 (refer to, for example, FIG. 2B). The same applies to other solder balls that will be described below. Connecting pads 11c are formed on the upper surface 11a of the mounting portion 11, and connecting pads 12d are formed on a lower surface 12b of the mounting portion 12. To facilitate understanding, FIG. 1A illustrates the connecting pads 12d projecting from the lower surface 12b of the mounting portion 12. Actually, the connecting pads 12d may be formed in the mounting portion 12 (for example, refer to FIG. 2B). The same applies to the connecting pads 11c of the mounting portion 11 and to other connecting pads that will be described below. The connecting pads 11c of the mounting portion 11 are connected by the solder balls 21 to the connecting pads 12d of the mounting portion 12. The solder balls 21 are examples of conductive connecting members.

The solder balls 21 may be formed from, for example, an alloy including lead (Pb), an alloy including tin (Sn) and copper, an alloy including tin and silver (Ag), or an alloy including tin, silver, and copper. Further, the solder balls 21 may be cored solder balls having copper (Cu) or resin cores. Instead of the solder balls 21, for example, metal terminals or conductive adhesive may be used as the conductive connecting members.

In the same manner, the mounting portion 12 and the mounting portion 13, which is located immediately above the mounting portion 12, are connected to each other by solder balls 22. Connecting pads 12c are formed on the upper surface 12a of the mounting portion 12, and connecting pads 13d are formed on a lower surface 13b of the mounting portion 13. The connecting pads 12c are connected by the solder balls 22 to the connecting pads 13d. The solder balls 22 are examples of conductive connecting members.

The solder balls 22 may be formed from, for example, an alloy including lead (Pb), an alloy including tin (Sn) and copper, an alloy including tin and silver (Ag), or an alloy including tin, silver, and copper. Further, the solder balls 22 may be cored solder balls having copper (Cu) or resin cores. Instead of the solder balls 22, for example, metal terminals or conductive adhesive may be used as the conductive connecting members.

External connection terminals 23 are arranged on a lower surface lib of the mounting portion 11. The external connection terminals 23 are connected to connecting pads 11d formed on the lower surface lib of the mounting portion 11.

The external connection terminals 23 may be, for example, solder balls. The solder balls may be formed from, for example, an alloy including lead (Pb), an alloy including tin (Sn) and copper, an alloy including tin and silver (Ag), or an alloy including tin, silver, and copper. The external connection terminals 23 may be used to connect the semiconductor device 1 to a mounting substrate such as a motherboard.

Figure 1B:
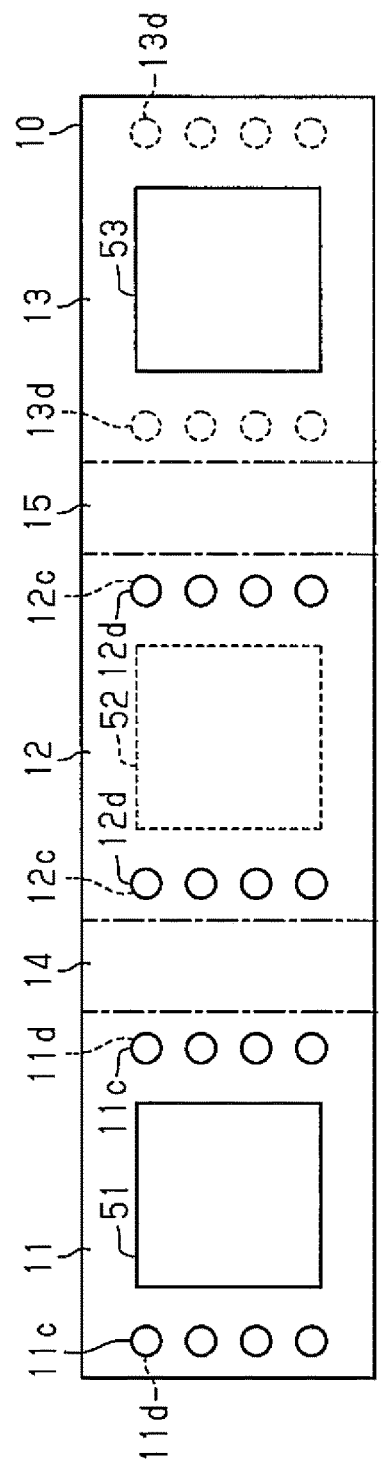
FIG. 1B is a schematic plan view of the wiring substrate of FIG. 1A, including the mounted semiconductor chips, in a spread-out state.
Figure 1C:
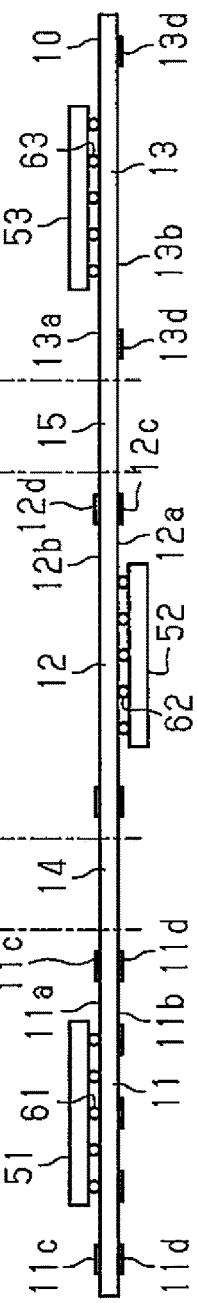
FIG. 1C is a schematic side view of the wiring substrate illustrated in FIG. 1B.

FIGS. 1B and 1C illustrate the wiring substrate 10 of FIG. 1A in a spread-out state. The wiring substrate 10 is rectangular. To facilitate understanding, in FIGS. 1B and 1C, single-dashed lines are used to indicate boundaries of the mounting portions 11 to 13 and the connecting portions 14 and 15. However, the mounting portions 11 to 13 are constructed in the same manner as the connecting portions 14 and 15. Thus, the boundaries of the mounting portions 11 to 13 and the connecting portions 14 and 15 are actually not clear.

As illustrated in FIG. 1C, when the wiring substrate 10 is spread out, the semiconductor chips 51 and 53 are mounted on the upper surface of the wiring substrate 10, and the semiconductor chip 52 is mounted on the lower surface of the wiring substrate 10. The wiring substrate 10 is folded by bending the connecting portions 14 and 15 so that the mounting portions 11 to 13 are stacked in the vertical direction spaced apart from one another. As illustrated in FIG. 1A, this forms the semiconductor device 1 with the semiconductor chips 51 to 53 mounted on the upper surfaces 11a to 13a of the mounting portions 11 to 13.

FIGS. 2A to 2C illustrate one example of the configuration of the wiring substrate 10.

FIG. 2B is a partially enlarged, cross-sectional view of the wiring substrate 10 of FIG. 1A illustrating part of the mounting portion 12 and some of the solder balls 21 and 22 formed on the mounting portion 12. The wiring substrate 10 includes a plurality of (for example, three) wiring layers 31, 32, and 33, a plurality of (for example, two) insulation layers 34 and 35, and a plurality of (for example, two) resist layers 36 and 37.

As illustrated in FIG. 2B, in the mounting portion 12, the wiring layer 31 is formed on a lower surface of the insulation layer 34, and the wiring layer 32 is formed on an upper surface of the insulation layer 34. The wiring layer 32 is covered by the insulation layer 35, and the wiring layer 33 is formed on an upper surface of the insulation layer 35. The resist layer 36 cover parts of the insulation layer 34 and the wiring layer 31. The resist layer 36 includes openings 36X that expose parts of the wiring layer 31 as the connecting pads 12d. The resist layer 37 covers parts of the insulation layer 35 and the wiring layer 33. The resist layer 37 includes openings 37X that expose parts of the wiring layer 33 as the connecting pads 12c.

The solder balls 22 are connected to the connecting pads 12c, and the solder balls 21 are connected to the connecting pads 12d. The solder balls 21 and 22 illustrated at the left side in FIG. 2B are electrically connected to each other by the wiring layers 31 to 33 of the mounting portions 12 (including connecting pad 12c of wiring layer 31 and connecting pad 12d of wiring layer 33). Accordingly, the semiconductor device 1 of FIG. 1A includes a signal transmission path extending straight in the stacking direction from the solder ball 21 to the solder ball 22 via the wiring layers 31 to 33 of the mounting portion 12. In addition to transmitting electric signals, the signal transmission path may be used to transmit ground voltage or drive voltage for the semiconductor chips 51 to 53.

Although not illustrated in detail in the drawings, the mounting portions 11 and 13 may also be configured in the same manner as the mounting portion 12. Further, in the same manner as the structure of FIG. 2B, each solder ball 21 may be electrically connected by the wiring layers 31 to 33 of the mounting portion 11 to the corresponding external connection terminal 23. In this case, the semiconductor device 1 of FIG. 1A may include a signal transmission path that extends straight in the stacking direction from the external connection terminal 23 to the mounting portion 13 via the wiring layers 31 to 33 of the mounting portion 11, the solder ball 21, the wiring layers 31 to 33 of the mounting portion 12, and the solder ball 22.

The wiring layers 31 to 33 may be formed from, for example, copper (Cu) or a copper alloy. The insulation layers 34 and 35 may be formed from a resin material, such as polyimide resin or polyester resin, or a liquid crystal polymer. The resist layers 36 and 37 may be formed from, for example, an epoxy insulation resin or an acrylic insulation resin.

FIG. 2A is a partially enlarged, cross-sectional view of the wiring substrate 10 illustrated in FIG. 1A. FIG. 2A illustrates part of the mounting portion 12 in the mounting region of the semiconductor chip 52 illustrated in FIG. 1A, part of the mounting portion 11 in the mounting region of the semiconductor chip 51 illustrated in FIG. 1A, and the connecting portion 14 between the mounting portion 11 and the mounting portion 12.

In the mounting portion 12, the resist layer 37 includes openings 37Y that expose parts of the wiring layer 33 as mounting pads 33a and 33b. The wiring layer 32 includes a ground wiring line 32G connected to the mounting pad 33b. The ground wiring line 32G extends from the mounting portion 12 via the connecting portion 14 to the mounting portion 11. Solder bumps 62S and 62G, which correspond to solder bumps 62 illustrated in FIG. 1A, are connected to the mounting pads 33a and 33b, respectively. For example, the solder bump 62S is connected to a signal terminal (not illustrated) of the semiconductor chip 52 in FIG. 1A, and the solder bump 62G is connected to a ground terminal (not illustrated) of the semiconductor chip 52. Further, in the mounting portion 12, the wiring layer 33 includes a signal wiring line 33S connected to the mounting pad 33a. The signal wiring line 33S extends from the mounting portion 12 via the connecting portion 14 to the mounting portion 11. In the present example, the signal wiring line 33S and the ground wiring line 32G form a signal transmission path (transmission line) that differs from the signal transmission path of FIG. 2B. Preferably, a typical transmission line is a characteristic impedance-matched wiring line. For example, when a high-speed signal is transmitted through the transmission line, a microstrip structure (microstrip line) illustrated in FIG. 2C is used as the transmission line. The microstrip structure includes the ground wiring line 32G of the wiring layer 32 and the signal wiring line 33S that is finer (has a narrower wiring width) than the ground wiring line 32G. The insulation layer 35 is sandwiched between the ground wiring line 32G and the signal wiring line 33S. The microstrip structure allows for the transmission of high-frequency signals through the signal wiring line 33S.

As illustrated in FIG. 2A, the connecting portion 14 is bent to arrange the mounting portion 12 above the mounting portion 11. Thus, the wiring layers 31 to 33, the insulation layers 34 and 35, and the resist layers 36 and 37 are arranged in the mounting portion 11 in an order that is reversed from that of the mounting portion 12. Accordingly, the mounting portion 12 includes the resist layer 36, the wiring layer 31, the insulation layer 34, the wiring layer 32, the insulation layer 35, the wiring layer 33, and the resist layer 37 arranged in order from the lower side. The mounting portion 11 includes the resist layer 37, the wiring layer 33, the insulation layer 35, the wiring layer 32, the insulation layer 34, the wiring layer 31, and the resist layer 36 arranged in order from the lower side.

Thus, the wiring layer 33, which includes the signal wiring line 33S, is the uppermost wiring layer of the mounting portion 12 and the lowermost wiring layer of the mounting portion 11. In the example of FIG. 2A, the wiring layer 33 of the mounting portion 11 includes a via 33V connected to the signal wiring line 33S. The wiring layer 32 includes a wiring line 32P, which is connected to the via 33V, and a via 32V, which is connected to the wiring line 32P. The wiring layer 31 includes a wiring line 31PS connected to the via 32V. A solder bump 61S, which corresponds to one of the solder bumps 61 illustrated in FIG. 1A, is connected to the wiring line 31PS. The solder bump 61S is connected to a signal terminal (not illustrated) of the semiconductor chip 51 of FIG. 1A.

In the same manner as the signal wiring line 33S of the wiring layer 33, the wiring layer 31 may also include a signal wiring line 31S extending from the mounting portion 12 via the connecting portion 14 to the mounting portion 11. Although not illustrated in the drawings, the signal wiring line 31S may also be used to electrically connect the semiconductor chip 51 on the mounting portion 11 and the semiconductor chip 52 on the mounting portion 12. Further, the signal wiring line 31S may also be used together with the ground wiring line 32G to form a signal transmission path of a microstrip structure (microstrip line).

In the example of FIG. 2A, the wiring layer 32, which includes the ground wiring line 32G, is an intermediate layer in each of the mounting portions 11 and 12. The wiring layer 32 of the mounting portion 11 includes the via 32V connected to the ground wiring line 32G. The wiring layer 31 includes a wiring line 31PG connected to the via 32V. A solder bump 61G, which corresponds to one of the solder bumps 61 illustrated in FIG. 1A, is connected to the wiring line 31PG. The solder bump 61G is connected to a ground terminal (not illustrated) of the semiconductor chip 51 of FIG. 1A.

The semiconductor device 1 has the advantages described below.

(1) The semiconductor device 1 includes the wiring substrate 10 that has flexibility. The wiring substrate 10 includes the mounting portions 11 to 13 and the connecting portions 14 and 15, which connect the mounting portions 11 to 13. The semiconductor chips 51 to 53 are mounted on the mounting portions 11 to 13, respectively. The wiring substrate 10 is folded by bending the connecting portions 14 and 15 to stack the semiconductor chips 51 to 53 together with the mounting portions 11 to 13. Only the wiring substrate 10 (mounting portions 12 and 13 in example of FIG. 1A) exists between the semiconductor chips 51 to 53. Thus, the semiconductor device 1 is reduced in size, particularly, thickness in the stacking direction (vertical direction) in comparison with a structure in which semiconductor chips are stacked respectively mounted on intermediate substrates such as interposers stacked by using a flexible substrate.

(2) The wiring substrate 10, which has flexibility, is folded to stack the semiconductor chips 51 to 53. Thus, only one type of the wiring substrate 10 is used. This reduces the number of components and simplifies the structure.

(3) The wiring substrate 10 includes the wiring layers 31 to 33. The wiring layers 31 to 33 are connected to the terminals of the semiconductor chips 51 to 53. The wiring layers 31 and 33 include the signal wiring lines 31S and 33S. The wiring layer 32 includes the ground wiring line 32G. The signal wiring line 31S and the ground wiring line 32G form a characteristic impedance-matched transmission line (e.g., microstrip line). In the same manner, the signal wiring line 33S and the ground wiring line 32G form a characteristic impedance-matched transmission line (e.g., microstrip line). Such transmission lines allow for efficient transmission of high-frequency signals.

(4) The mounting portions 11 to 13 (wiring layers 31 to 33) are connected to one another by the solder balls 21 and 22, which are conductive connecting members. Accordingly, the solder balls 21 and 22 function as a path electrically connecting the semiconductor chips 51 to 53 and also as a path electrically connecting the semiconductor chips 51 to 53 and the external connection terminals 23. Such a path may be used to transmit low-frequency signals or supply operational voltage.

It should be apparent to those skilled in the art that the foregoing embodiments may be implemented in many other specific forms without departing from the scope of this disclosure. Particularly, it should be understood that the foregoing embodiments may be implemented in the following forms.

In the above embodiment, the transmission path has a microstrip function but may have another structure.

Figure 3A:
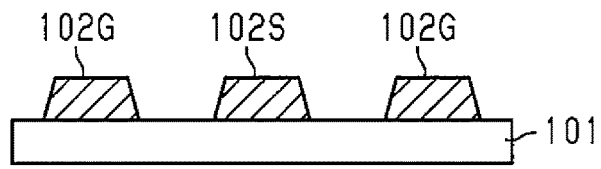
FIGS. 3A and 3B are schematic cross-sectional views illustrating various examples of the transmission line.

FIG. 3A illustrates a transmission line having an exemplary coplanar structure (coplanar line). The transmission line includes a signal wiring line 102S and two ground wiring lines 102G formed on an upper surface of an insulation layer 101. The signal wiring line 102S is located between the two ground wiring lines 102G. Such a coplanar structure is also suitable for transmitting high-frequency signals.

Figure 3B:
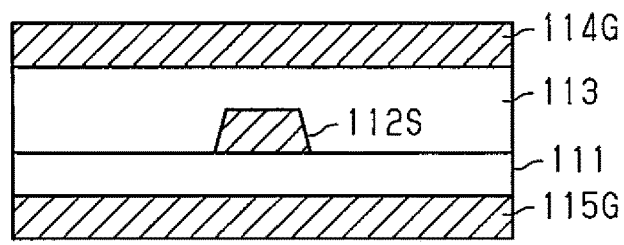

FIG. 3B illustrates a transmission line having an exemplary strip structure (strip line). The transmission line includes a signal wiring line 112S formed on an upper surface of an insulation layer 111, a ground wiring line 114G formed on an upper surface of an insulation layer 113 covering the signal wiring line 112S, and a ground wiring line 115G formed on a lower surface of the insulation layer 111. Such a strip structure is also suitable for transmitting high-frequency signals.

In the above embodiment, the wiring substrate 10 includes the resist layers 36 and 37. However, at least one of the resist layers 36 and 37 may be omitted. Further, the upper surface of only one of the wiring layers 31 and 33 may be exposed from the insulation layer 34 or 35. This decreases the thickness of the semiconductor device 1 in the stacking direction (vertical direction) and allows for reduction in size of the semiconductor device 1.

Figure 4:
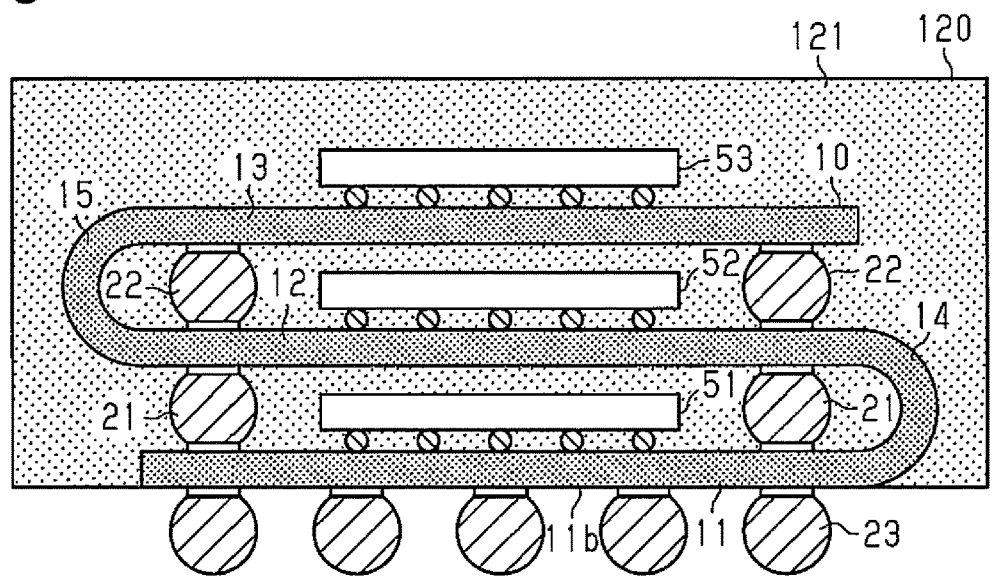
FIGS. 4 and 5 are schematic cross-sectional views illustrating various examples of the semiconductor device.

In the above embodiment, the semiconductor chips 51 to 53 may be resin-encapsulated. For example, as illustrated in FIG. 4, a semiconductor device 120 includes the wiring substrate 10, the semiconductor chips 51 to 53 mounted on the wiring substrate 10, and an encapsulation resin 121 encapsulating the wiring substrate 10 and the semiconductor chips 51 to 53. The encapsulation resin 121 encapsulates the wiring substrate 10 and the semiconductor chips 51 to 53, while exposing the lower surface 11b of the mounting portion 11 and the external connection terminals 23.

In the above embodiment, the three mounting portions 11 to 13, which are connected by the two connecting portions 14 and 15, are stacked. However, the number of the mounting portions and connecting portions may be changed.

Figure 5:
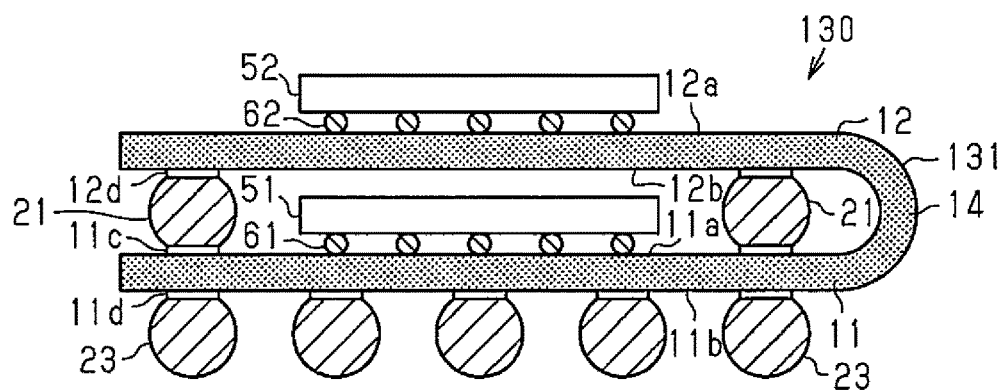

FIG. 5 illustrates a further example of a semiconductor device 130. The semiconductor device 130 includes a wiring substrate 131, the semiconductor chips 51 and 52, and the solder balls 21. The wiring substrate 131 includes the two mounting portions 11 and 12 on which the semiconductor chips 51 and 52 are mounted, and the connecting portion 14 connecting the two mounting portions 11 and 12. The connecting portion 14 is bent to stack the mounting portions 11 and 12 in the stacking direction (vertical direction) spaced apart from each other. The semiconductor device 130 is smaller in size than the semiconductor device 1. In the same manner as the semiconductor device 120 illustrated in FIG. 4, the wiring substrate 131 and the semiconductor chips 51 and 52 of the semiconductor device 130 may be resin-encapsulated.

Although not illustrated in the drawings, a semiconductor device may be formed using a wiring substrate including four or more mounting portions and three or more connecting portions by bending the connecting portions and stacking the mounting portions.

In the above embodiment, the semiconductor chips 51 to 53 are flip-chip mounted and connected to the wiring substrate 10. However, the semiconductor chips 51 to 53 may be die-bonded to the wiring substrate 10, and bonding wires may be used to connect the semiconductor chips 51 to 53 to the wiring substrate 10. For example, fine wires of gold (Au), aluminum (Al), or the like may be used as the bonding wires. In this case, it is preferable that the semiconductor chips 51 to 53 and the bonding wires be resin-encapsulated. The encapsulation resin may be, for example, an epoxy resin, a polyimide resin, a phenol resin, or a vinyl chloride resin.

In the above embodiment, in addition to or instead of semiconductor chips, electronic components (chip components) including resistors and/or capacitors may be mounted on the wiring substrate 10. The electronic components are not limited to passive components such as resistors or capacitors and may be active components such as transistors. In such cases, in the same manner as the semiconductor chips 51 to 53 of the above embodiment, the electronic components may be mounted on the upper surface, lower surface, or both surfaces of each of the mounting portions 11 to 13 in the folded wiring substrate 10.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device comprising:
    a wiring substrate that has flexibility and includes a first surface and a second surface located at opposite to the first surface, wherein the wiring substrate includes
    at least two mounting portions that are stacked spaced apart from each other, the at least two mounting portions including:
        a first mounting portion having first connecting pads at the first surface, and
        a second mounting portion adjacent to the first mounting portion in a stacking direction and having second connecting pads at the first surface and third connecting pads at the second surface, and
    at least one connecting portion, each of the at least one connecting portion being bent to connect two of the at least two mounting portions that are adjacent in the stacking direction;
    at least one semiconductor chip mounted on at least the first mounting portion of the at least two mounting portions;
    a plurality of conductive connecting members connecting the at least two mounting portions to each other in the stacking direction, the plurality of conductive connecting members being arranged between the at least two mounting portions without an interposer, each of the plurality of conductive connecting members having a height corresponding to a distance between adjacent two of the at least two mounting portions, the conductive connecting members including
        a set of first conductive connecting members, wherein each of the first conductive connecting members is directly connected to both a corresponding one of the first connecting pads and a corresponding one of the second connecting pads and extends across a gap between the corresponding one of the first connecting pads and the corresponding one of the second connecting pads in the stacking direction; and a set of second conductive connecting members, wherein each of the second conductive connecting members is directly connected to a corresponding one of the third connecting pads; and an encapsulation resin encapsulating all of the wiring substrate, the at least one semiconductor chip, and the plurality of conductive connecting members, wherein the wiring substrate includes a plurality of wiring layers and an insulation layer located between the plurality of wiring layers, and wherein the second mounting portion includes a first signal transmission path that extends straight through the second mounting portion in the stacking direction and is formed by the plurality of wiring layers electrically connected at a position overlapped with both of one of the first conductive connecting members and one of the second conductive connecting members.

2. The semiconductor device according to claim 1, wherein:

the at least one semiconductor chip includes
a first semiconductor chip mounted on the first mounting portion, and
a second semiconductor chip mounted on the second mounting portion;

the at least one connecting portion includes a first connecting portion connecting the first mounting portion and the second mounting portion;

the wiring substrate includes a transmission line that extends from the first mounting portion via the first connecting portion to the second mounting portion to form a second signal transmission path, the first semiconductor chip is electrically connected to the second semiconductor chip by at least one of the first signal transmission path and the second signal transmission path.

3. The semiconductor device according to claim 2, wherein the second signal transmission path includes at least one ground wiring line and a signal wiring line that is finer than the at least one ground wiring line.

4. The semiconductor device according to claim 2, wherein the second signal transmission path includes two ground wiring lines and a signal wiring line located between the two ground wiring lines.

5. The semiconductor device according to claim 2, wherein the transmission line is a characteristic impedance-matched wiring line.

6. The semiconductor device according to claim 1, wherein the at least one semiconductor chip is a bare chip and flip-chip mounted on at least one of the at least two mounting portions.

* * * * *